Oct. 17, 1967 D. J. CARLSON ET AL 3,348,062

ELECTRICAL CIRCUIT EMPLOYING AN INSULATED GATE FIELD EFFECT TRANSISTOR HAVING OUTPUT CIRCUIT MEANS COUPLED TO THE SUBSTRATE THEREOF

Filed Jan. 2, 1963 2 Sheets-Sheet 1

INVENTORS
DAVID J. CARLSON AND
GERALD E. THERIAULT

BY Eugene M. Whitacre

ATTORNEY

INVENTORS
DAVID J. CARLSON AND
GERALD E. THERIAULT
BY
Eugene M. Whitacre
ATTORNEY United States Patent Office 3,348,062
Patented Oct. 17, 1967

3,348,062

ELECTRICAL CIRCUIT EMPLOYING AN INSULATED GATE FIELD EFFECT TRANSISTOR HAVING OUTPUT CIRCUIT MEANS COUPLED TO THE SUBSTRATE THEREOF

David J. Carlson, Princeton, and Gerald E. Theriault, Hopewell, N.J., assignors to Radio Corporation of America, a corporation of Delaware Filed Jan. 2, 1963, Ser. No. 248,947
20 Claims. (Cl. 307—88.5)

This invention relates in general to electrical circuits employing semiconductor devices and more particularly to electrical signal translating circuits for deriving a voltage or signal which is related to the signal translated by the circuit.

It is an object of this invention to provide an improved electrical circuit employing an insulated-gate field-effect semiconductor device.

It is another object of this invention to provide an improved signal translating circuit employing an insulated-gate field effect semiconductor device which provides a rectified output voltage.

It is a further object of this invention to provide an improved detector circuit having an automatic gain control output signal.

It is still a further object of this invention to provide an improved clipping circuit in which the angle of clipping is adjustable but insensitive to amplitude variations of the input signal.

An electrical circuit embodying the invention comprises an insulated-gate field-effect semiconductor device which has gate source and drain electrodes formed on a substrate of semiconductor material. The gate, source and drain electrodes are connected to condition the semiconductor device to operate as the active element of an electrical signal translating circuit. Circuit means are coupled to the substrate of semiconductor material to derive a signal from the substrate, which is related to the signal translated by the translating circuit.

For example, if the signal translated by the device comprises a signal modulated carrier wave, the voltage derived from the substrate may comprise the frequency or amplitude modulation components of the wave. Alternatively, with suitable filtering the voltage derived from the substrate comprises a direct voltage whose amplitude is related to the average level of the signal modulated carrier wave. Such a direct voltage is useful as an automatic gain control voltage in signal receivers.

In accordance with an embodiment of the invention, an insulated-gate field-effect transistor comprising first and second electrodes formed on a substrate of semiconductor material is connected in a circuit to operate as a constant angle clipper. A source of alternating current signal voltage to be clipped or limited is coupled to the first electrode and an output circuit is coupled to the second electrode of the device. A filter circuit is coupled to the substrate to develop a voltage as a function of the amplitude of the applied signal. The voltage developed at the substrate is applied as a direct control voltage to the gate electrode of the device. The biasing of the gate electrode with respect to the first and second electrodes is thus a function of the amplitude of the alternating current input signal voltage. As will be explained hereinafter, only signal excursions in one polarity direction are translated in circuits of this type. The direct control voltage alters the translation characteristic so that the angle of clipping is held constant with changes in the amplitude of the applied signal voltage.

In accordance with another embodiment of the invention an insulated-gate field-effect semiconductor device is connected in a phase detection circuit configuration. Circuit means are coupled to the drain electrode for biasing the output electrode to a predetermined bias potential. A pair of input signals whose phase relationship is to be determined, are applied respectively to the source and gate electrodes of the semiconductor device. Filter circuit means are coupled to the substrate of semiconductor material to derive a bias potential which is coupled to the gate electrode to control the conduction point of the semiconductor device. The output signal derived at the output electrode has a magnitude which is a function of the phase difference of the two input signals.

The novel features which are considered characteristic of the invention are set forth with particularity in the appended claims. The invention itself, however, both as to its organization and method of operation as well as additional objects and advantages thereof will best be understood from the accompanying drawing in which:

Figure 1:
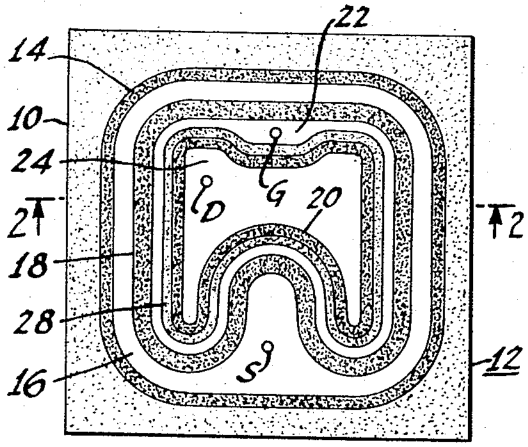
FIGURE 1 is a diagrammatic view of a field-effect transistor suitable for use in circuits embodying the invention.

Referring now to the drawings and particularly to FIGURE 1, a field-effect transistor 10 which may be used with circuits embodying the invention includes a body 12 of semiconductor material. The body 12 may be either a single crystal or polycrystalline and may be of any of the semiconductor materials used to prepare transistors in the semiconductor art. For example the body 12 may be nearly intrinsic silicon, such as for example lightly doped P-type silicon of 100 ohm-cm. material.

In the manufacture of the device shown in FIGURE 1, heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source and drain regions are to be formed.

Figure 2:
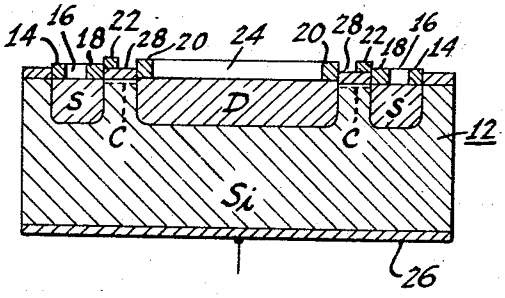
FIG. 2 is a cross section view taken along section line 2—2 of FIGURE 1.

The body 12 is then heated in a suitable atmosphere, such as in water vapor, so that exposed silicon areas are oxidized to form grown silicon dioxide layers indicated by the lightly stippled areas of FIGURE 1. During the heating process, impurities from the deposited silicon dioxide layer diffuse into the silicon body 12 to form the source and drain regions. FIGURE 2, which is a cross sectional view taken along section 2—2 of FIGURE 1, shows, the source-drain regions labelled S and D respectively.

By means of another photo-resist and acid etching or like step, the deposited silicon dioxide over part of the source-drain diffused regions is removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1, in which the lightly stippled area between the outside boundary and the first dark zone 14 is grown silicon dioxide. The white area 16 is the metal electrode corresponding to the source electrode. Dark or more heavily stippled zones 14 and 18 are deposited silicon dioxide zones overlying a portion of the diffused source region, and the dark zone 20 is a deposited silicon dioxide zone overlying a portion of the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2. The silicon wafer is mounted on a conductive base or header 26 as shown in FIGURE 2. The layer of grown silicon dioxide 28 on which the gate electrode 22 is mounted, overlies an inversion layer or conducting channel C connecting the source and drain regions. The gate electrode 22 is displaced towards the source region S so that the distance between the source region S and the gate electrode 22 is smaller than the distance between the gate electrode 22 and the drain region D. If desired, the gate electrode may overlap the deposited silicon dioxide layer 18.

Figure 3:
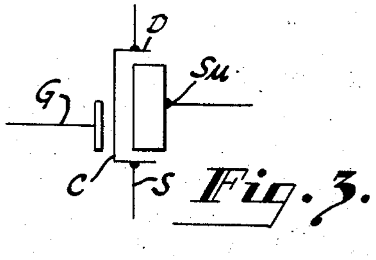
FIGURE 3 is a symbolic representation of an insulated gate field effect transistor.

FIGURE 3 is a symbolic representation of the insulated gate field effect transistor previously described in FIGURES 1 and 2. There is shown the gate electrode G, the drain electrode D, the source electrode S, and the substrate of semiconductor material $S_u$. It should be noted that electrodes D and S operate as the drain and the source electrodes as a function of the polarity of the bias potential applied therebetween; i.e. the electrode to which a positive bias potential is applied (relative to the bias potential applied to the other electrode) operates as a drain electrode, and the other electrode operates as a source electrode.

The drain and source electrodes are connected to each other by a conductive channel C. The majority current carriers (in this case electrons) flow from source to drain in this thin channel region close to the surface. The conductive channel C is shown in FIGURE 2 in dotted lines.

Figure 4:
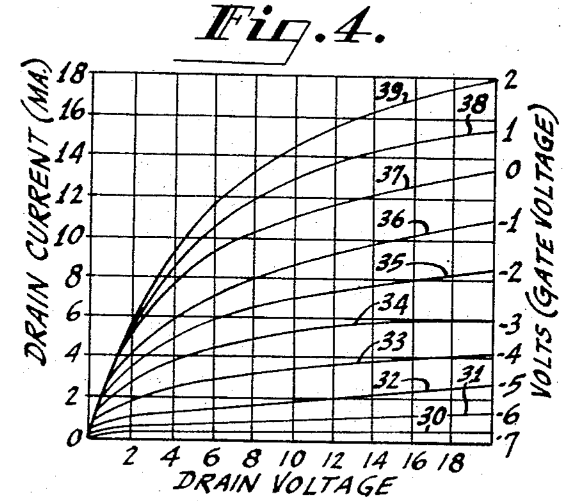
FIGURE 4 is a graph showing a family of drain current versus drain voltage curves, for various values of gate-to-source voltages for the transistor of FIGURE 1.

FIGURE 4 is a family of curves 30–39 illustrating the drain current versus drain voltage characteristic of the transistor of FIGURE 1 for different values of gate-to-source voltage. A feature of an insulated-gate field-effect transistor is that the zero bias characteristic can be at any of the curves 30–39. In FIGURE 4 the curve 37 corresponds to the zero bias gate-to-source voltage. Curves 38 and 39 represent positive gate voltages relative to the source and the curves 30–36 represent negative gate voltages relative to the source.

The location of the zero bias curve is selected during the manufacture of the transistor, i.e. by controlling the time and/or temperature of the step of the process when the silicon dioxide layer 28 shown in FIGURES 1 and 2 is grown.

Reference is now made to FIGURE 2 of the drawings. The boundaries separating the source and drain regions S and D and the body of silicon substrate 12 effectively operates as a pair of rectifying junctions coupling the silicon substrate 12 to the source and drain electrodes 16 and 24, in such a manner that a positive bias voltage applied to the substrate with respect to the drain and source electrodes 16 and 24 renders the rectifying junction conductive.

Figure 5:
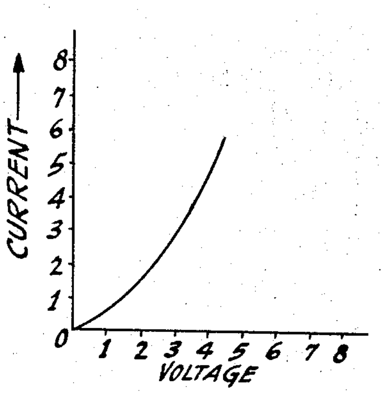
FIGURE 5 is a graph showing the voltage versus current characteristic of each of the effective drain-substrate and source-substrate rectifying junctions of the field-effect transistor shown in FIGURES 1 and 2.

It is to be understood that the poling of the rectifying junctions described is representative of a transistor of the type described in connection with FIGURES 1 and 2 wherein the substrate is of P-type material relative to the source and drain electrodes. However, the transistor device can be fabricated where the substrate is of N-type material relative to the source and drain electrodes. In devices of the latter type, the rectifying junctions would be poled such that the anode side of the rectifying junction appears at the source and drain electrodes, and the cathode side of these junctions appears at the substrate. The description will be restricted to the type of device described in connection with FIGURES 1 and 2 wherein the substrate is of P-type material relative to the source and drain electrodes. The current versus voltage characteristic of each of these rectifying junctions is shown in FIGURE 5.

An insulated-gate field-effect transistor, similar to the one described in connection with FIGURES 1 and 2, has an input impedance measured between the gate electrode and the source electrode that appears as a parallel circuit comprising a small capacitor (approximately $2\times10^{-12}$ farads) and a leakage resistor of approximately $10^{14}$ ohms (for low frequencies such as audio frequencies). In the VHF range the equivalent input impedance of the device appears as a resistance of several thousand ohms (2.17K ohms at approximately 250 mc.) and a parallel capacitor of approximately $2\times10^{-12}$ farads.

Figure 6:
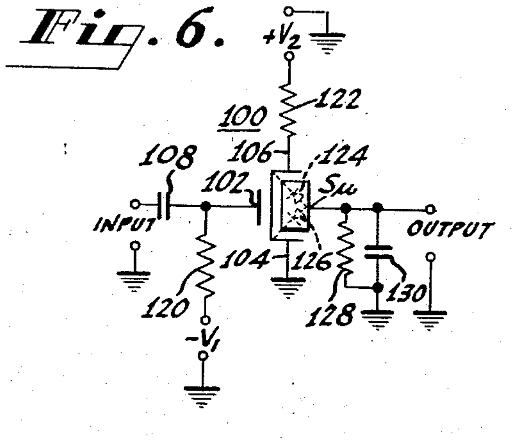
FIGURE 6 is a schematic circuit diagram of a signal translating circuit embodying the invention.

Referring now to the amplifier circuit of FIGURE 6 of the drawings, there is shown a field effect transistor 100, similar to the one shown in FIGURES 1 and 2, comprising a gate electrode 102, a source electrode 104 and a drain electrode 106. Input signals are applied from a signal source (not shown) between the gate electrode 102 and a point of reference potential, shown as ground, through a coupling capacitor 108. The gate electrode 102 of the field effect transistor 100 is biased to a desired bias potential by means of a source of bias potential, which may comprise a battery $-V_1$ (not shown), through a resistor 120. A source of bias potential $V_2$ (not shown) biases the drain electrode 106 through a resistor 122 positively with respect to the source electrode 104, the latter being connected to ground.

A pair of rectifying junctions 124 and 126 exist between the substrate $S_u$ and the source and drain electrode 104 and 106 respectively as previously described in connection with FIGURES 1 and 2. The rectifying junctions 124 and 126 are poled so that when the bias potential of the substrate $S_u$ is more positive then the bias potential of the drain and source electrodes 106 and 104, respectively, the rectifying junctions 124 and 126 are rendered conductive. A filter network including a resistor 128 and a capacitor 130 is connected between the substrate and ground. An output voltage is derived across the capacitor 130.

In operation, input signals are coupled from an alternating current source through the capacitor 108 to the gate electrode 102 of the field effect transistor 100. The input signals are also coupled to the substrate of semiconductor material $S_u$ by means of intrinsic capacitance which exists between the gate electrode 102 and the substrate of semiconductor material $S_u$. The rectifying junctions 124 and 126 are rendered conductive when the amplitude of the signals coupled through the intrinsic capacitance drive the substrate to a potential which is positive with respect to the source or drain electrodes.

As the input signals are coupled to the substrate through the intrinsic capacitance, the capacitor 130 is charged by current flowing through the rectifying junction 126. The bias potential $V_2$ renders rectifying junction 124 nonconductive throughout the operation of the detector circuit, but it is to be understood that the relative values of the bias potential of the drain electrode 106 and the amplitude of the signal determines whether rectifying junction 124 is conductive or not. As the amplitude of the input signal becomes of a negative polarity, the rectifying junction 126 is rendered nonconductive and the capacitor 130 discharges through resistor 128 developing a direct current potential of negative polarity which is a function of the amplitude of the input signals. This output voltage may be utilized as an AGC signal. However, by proper selection of the RC time constant of the filter circuit connected to the substrate, the output voltage derived across the capacitor 130 may be a detected output signal corresponding to modulation information contained in a signal modulated carrier wave applied to the gate 102.

It should also be noted that an output signal may be derived across the resistor 122. If desired, a circuit tuned to the signal frequency may be substituted for the resistor 122 (with the appropriate adjustment of the bias potential at the gate electrode) to obtain amplification of the signal input. The circuit could be used as an I.F. amplifier in a radio signal receiver, for example.

It may be noted that if the drain electrode 106 is biased to a high positive voltage (more positive than the peak value of the input signals), the rectifying junction 124 will always be nonconductive, and hence rectification of the input signals will be accomplished by the conduction of the rectifying junction 126 only. As previously mentioned, the bias potential between the drain and source electrodes 106 and 104 may be zero. In such a case both rectifying junctions 124 and 126 will be rendered conductive by the input signals.

Figure 7:
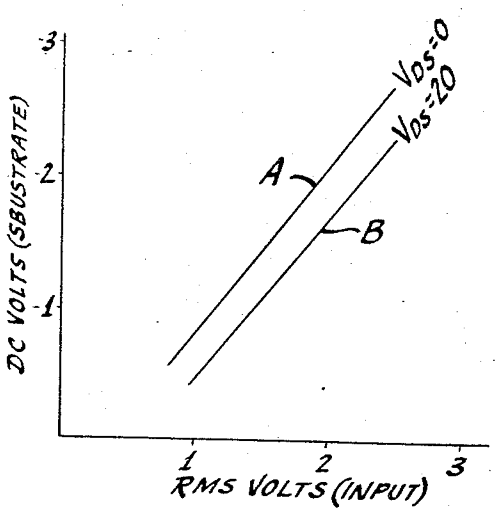
FIGURE 7 is a graph showing direct current (D.C.) volts output at the substrate versus RMS (root mean square) volts input (for input signals of the same frequency) curves for different values of drain-to-source voltages for the translating circuit shown in FIGURE 6.

FIGURE 7 of the drawings is a graph showing the rectified output voltage at the substrate $S_u$ of the field effect transistor 100, shown in FIGURE 6, versus the RMS input voltage for different values of drain-to-source bias voltages. The frequency of the input signals was 50 mc., and the gate-to-source bias voltage was —6.8 v. D.C. Curve A was obtained by applying zero volts between the source and drain electrodes 104 and 106. Curve B was obtained with 20 volts drain-to-source bias voltage. The relationship of the direct current (D.C.) output voltage at the substrate $S_u$, for the same RMS input voltage, is lower with a drain-to-source bias voltage of 20 volts than for a zero drain-to-source bias voltage. This is believed to be due to the fact that the back resistance of the rectifying junction 124 together with the resistors 122 and 128 provide a voltage divider between ground and the positive terminal of $V_2$ which produces a small positive voltage at the substrate which reduces the negative output voltage appearing across the capacitor 130.

Figure 8:
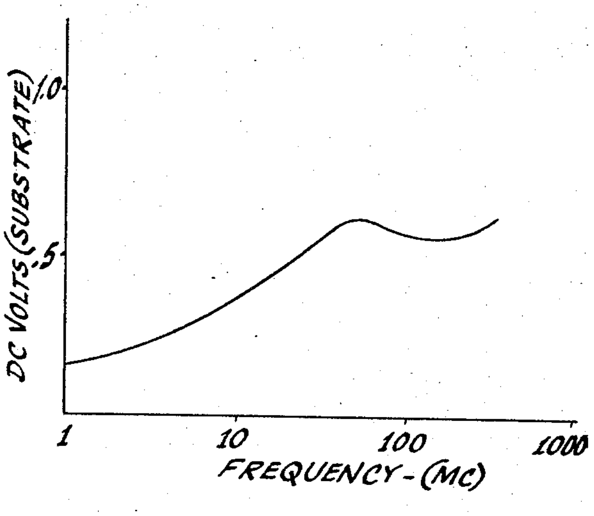
FIGURE 8 is a graph showing the D.C. voltage output at the substrate as a function of the input signal (frequency) for the circuit shown in FIGURE 6.

FIGURE 8 of the drawings shows the variation in the rectified output voltage derived at the substrate $S_u$ of the field effect transistor 100 as the frequency of the input signal is varied. The input signals applied had a constant amplitude of 1 volt RMS, the gate-to-source bias voltage was —6.8 v. D.C. and no bias potential was applied between drain and source electrodes. FIGURE 8 shows that the D.C. voltage derived from the substrate increases fairly linearly as the frequency of the input signals increases up to a point (approximately 90 mc.) at which the intrinsic capacitance of the device and the intrinsic inductance of the device (such as the leads connecting the header and the drain and source electrodes) resonate decreasing the output voltage slightly. Past this point, the output voltage continues to increase with increases in frequency.

The circuit shown in FIGURE 6 may then be also used to detect frequency variations in input signals provided that the amplitude of the input signals is held constant.

Figure 9:
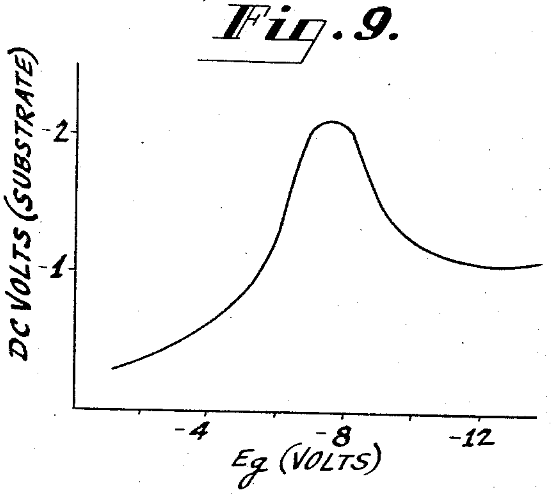
FIGURE 9 is a graph showing the direct current voltage output at the substrate of the field effect transistor shown in FIGURE 6 as a function of the gate-to-source voltage.

FIGURE 9 of the drawings shows the rectified output voltage appearing at the substrate $S_u$ of the field effect transistor in the circuit shown in FIGURE 6 as a function of the gate-to-source bias voltage for input signals having constant amplitude and frequency. No bias potential was applied between the source and drain electrodes. As the gate-to-source bias voltage increases negatively, the rectified output voltage from the substrate $S_u$ increases up to a point of maximum output. A further increase in the gate-to-source bias voltage in the negative direction decreases the output voltage up to a point (around —8 volts) at which a further increase in the negative direction of the gate-to-source voltage derives a substantially constant D.C. output voltage from the substrate $S_u$. It is believed that this may be explained as follows: When the gate-to-source bias voltage is small (around zero bias), the effective resistance of the conductive channel is very small and is thereby effectively at ground potential. The channel thus operates as a shield to prevent signal coupling between the gate electrode 102 and the substrate of semiconductor material $S_u$.

As the gate voltage is made more negative relative to the source electrode the effective resistance of the conductive channel increases, whereby a larger portion of the input signal is coupled to the substrate $S_u$ up to a point of maximum efficiency as indicated by the peak portion of the curve. As the gate voltage is made more negative, and more signal voltage is coupled to the substrate, the field gradient along the rectifying junctions is changed in a direction to increase the loading due to the substrate. Accordingly, the negative substrate voltage begins to decrease at some point as the gate is made more negative down to a relatively constant value at which further increases in the negative bias voltage applied to the gate does not result in a change of rectified output voltage.

Figure 10:
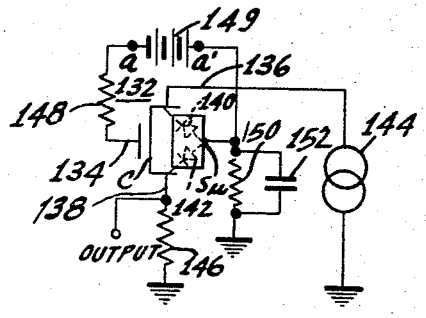
FIGURE 10 is a schematic circuit diagram of a limiter circuit embodying the invention.

Referring now to FIGURE 10, there is shown a constant angle clipping circuit which includes a field effect transistor 132 which is similar to the field effect transistor shown in FIGURES 1 and 2. The field effect transistor 132 comprises a gate or control electrode 134, which is insulated from the substrate $S_u$, and input and output electrodes 136 and 138 which are formed on the substrate of semiconductor material $S_u$ as previously described in connection with FIGURES 1 and 2.

A pair of rectifying junctions 140 and 142 appear between the substrate of semiconductor material $S_u$ and the input and output electrodes 136 and 138 respectively. An alternating current signal source 144 is connected between the input electrode 136 and a point of reference potential shown as ground. A resistor 146 is connected between the output electrode 138 and ground to derive output signals from the clipping circuit.

The substrate of semiconductor material $S_u$ is coupled through a pair of fixed contacts *a* and *a'*, and through a resistor 148 to the gate electrode 134. The fixed contacts *a* and *a'* are provided so that a source of bias potential (a battery 149 for example) may be connected between the terminals *a* and *a'* to bias the gate electrode 134 to a desired bias potential. The substrate of semiconductor material $S_u$ is coupled through a filter network including a resistor 150 and a capacitor 152 (connected in parallel) to ground, to derive a rectified output voltage from the substrate.

In operation, the source of bias potential indicated by the battery 149 is connected between the fixed terminals *a* and *a'* in such a manner that the gate electrode 134 is biased negatively with respect to the output electrode 138. The battery potential is sufficient to render the transistor nonconductive in the absence of any input signals. For purposes of discussion, the input signals from the signal source 144 are assumed to be sine waves.

In the positive half cycle of the input signals the input electrode 136 operates as the drain electrode and the output electrode 138 operates as the source electrode. The gate is biased negatively with respect to the electrode 138 sufficiently so that the field effect transistor 132 remains nonconductive.

During the negative half cycle of the input signals from the signal source 144 the input electrode 136 operates as the source electrode and the output electrode 138 operates as the drain electrode. When the instantaneous voltage between the gate electrode 134 and the input electrode 136 sufficiently reduces the reverse bias from the battery 149, current flows from ground and through the output resistor 146, the output electrode 138, the conductive channel C, the input electrode 136, and the signal source 144 back to ground. Since the electrode 136 is negative relative to ground, the rectifying junction 140 becomes conductive, charging the capacitor 152. The negative voltage developed across the capacitor 152, which is a function of input signal level, is coupled through the battery 149 and resistor 148 to the control electrode 134 varying the bias potential of the control electrode as a function of the amplitude of the input signal.

From the mode of operation just described, it should be noted that the field effect transistor 132 is rendered nonconductive during the positive half cycle and through a portion of the negative cycle as determined by the value of the bias potential applied to the control electrode 134. The angle of clipping may be defined as the number of degrees of the cycle in which the transistor is rendered conductive. As the amplitude of the input signal increases, the bias developed across the capacitor 152 increases accordingly thereby holding the angle of clipping substantially constant for variations in amplitude of the input signal. This may be explained as follows: As the amplitude in the input signal increases so does the bias derived from the substrate. The transistor 132 is driven further into cut-off so that although the transistor starts conducting at a more negative signal level it will conduct for approximately the same clipping angle.

Figure 11:
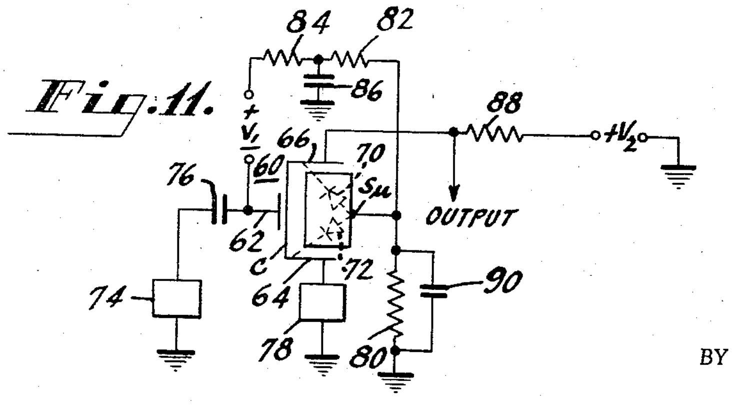
FIGURE 11 is a schematic circuit diagram of a phase detector embodying the invention.

Referring now to FIGURE 11, there is shown a phase detector circuit which includes an insulated gate field effect transistor 60 similar to the field effect transistor described in FIGURES 1 and 2. The field effect transistor 60 has a control electrode 62, an input electrode 64, an output electrode 66 and a substrate of semiconductor material $S_u$.

As previously described, a pair of rectifying junctions 70 and 72 exist between the substrate of semiconductor material $S_u$ and the output and input electrodes 66 and 64. An alternating current signal source 74 is coupled between a point of reference potential, shown as ground, and the control electrode 62 of the field effect transistor 60 through a coupling capacitor 76. The alternating current signal source 74 provides input signals of a frequency $f_1$. Another alternating curernt signal source 78 is coupled between the input electrode 64 and ground. The signal source 78 provides input signals of the same frequency $f_1$ but which may be out of phase with the signals from the signal source 74. A filter network comprising a resistor 80 and a capacitor 90 is connected between the substrate $S_u$ and ground. A series circuit comprising resistors 82 and 84 and a source of direct current voltage $V_1$ (not shown) connects the substrate $S_u$ to the control electrode 62. Resistors 82 and 84 are by-passed to ground by a capacitor 86 so that there is no signal voltage between the substrate $S_u$ and the control electrode 62.

The output electrode 66 of the field effect transistor 60 is coupled through a resistor 88 to a source of bias potential $V_2$ (not shown) to bias the output electrode 66 positively with respect to ground. The source of bias potential $V_2$ may be a battery connected between the drain electrode 66 and ground. Output signals are derived across the resistor 88 and are coupled to a utilization circuit (not shown). The negative terminal of the bias source $V_1$ is connected to the control electrode 62 of the field effect transistor 60 to bias the field effect transistor 60 near or at cut-off In operation, the field effect transistor 60 is rendered conductive when the signal from the signal source 78 is negative with respect to the potential at the gate electrode 62. As the field effect transistor 60 conducts, the potential at the source electrode 64 is negative with respect to the potential at the substrate $S_u$ rendering the rectifying junction 72 conductive. Current flow through the rectifying junction 72 and through the source electrode 64 charges the capacitor 90 to a voltage which is negative with respect to ground. This voltage derived from the substrate adds to the bias potential that is applied to the gate electrode 62 by the source $V_1$. The rectifying junction 70, however, is non-conductive because the potential at the drain electrode 66 is always positive with respect to the potential at the substrate $S_u$.

The signal from the signal source 74, in turn, modifies the instantaneous bias potential at the gate electrode 62 with respect to ground. The bias potential at the gate electrode 62 may be considered as a sinusoidally varying voltage having an instantaneous absolute value which depends on: (1) the amplitude of the potential $-V_1$ applied from the direct current source in the gate electrode circuit, (2) the bias developed across the capacitor 90, and (3) the instantaneous value of the alternating current signal from the signal source 74. The instantaneous bias potential at the gate electrode 62 with respect to the potential at the source electrode 64 determines the turn-on value of the field effect transistor 60. In the absence of signals from the source 74, the transistor 60 conducts when the signal from the signal source 78 becomes negative enough to overcome the cut-off bias due to the source $V_1$ as supplemented by the voltage across the capacitor 90. The magnitude of the signal from the signal source 78 controls the bias potential developed across the capacitor 90 which in turn controls in part the turn-on point of the field effect transistor 60. Accordingly, amplitude variations in the signals from signal source 78 will have a substantially negligible effect in the amplitude of the output signal derived across the output resistor 88.

It may be noted then that the angle of conduction (per cycle) of the field effect transistor 60 depends on: (1) the relative magnitude of the signals from signal sources 74, and (2) the phase relationship between the signals from the signal sources 74 and 78.

The magnitude of the output signal taken across the resistor 80 varies as a function of the phase relationship of the signals from the signal sources 74 and 78. It may be noted that the output voltage, where the signals from the sources 74 and 78 are 180° out of phase, will result in a larger output signal than for an in phase relationship between the signals.

The phase detector circuit shown in FIGURE 11 may be used as a synchronous detector circuit which, for example, may be used in the chroma demodulator circuit of a color television receiver.

The signal sources 74 and 78 may be respectively the chroma bandpass amplifier and the 3.58 mc. local oscillator (with their associated circuit elements) of a color television receiver. The chroma signal (which is the sidebands of a suppressed 3.58 mc. carrier, and which is amplitude and phase modulated), is applied to the gate electrode 62. The 3.58 mc. oscillator signal is applied to the source electrode 64. The output signal (detected signal output) derived at the drain electrode 66, has a variable amplitude representative of one of the colors, or color difference signals. It will be understood that two or more such demodulators will be used in a color television receiver.

What is claimed is:

1. An electrical circuit comprising:

an insulated gate field effect semiconductor device having first, second and gate electrodes formed on a semiconductor substrate, a pair of rectifying junctions respectively between said first and second electrodes and said substrate, and intrinsic capacitance between said gate electrode and said substrate, means connecting said first, second and gate electrodes to condition said semiconductor device to operate as the active element of said circuit, signal supply means coupled to one of said first, second and gate electrodes for supplying signals of a magnitude sufficient to forward bias at least one of said rectifying junctions to provide current flow therethrough, deriving means coupled to said substrate for deriving a signal voltage in response to said current flow, and signal utilization means coupled to receive said derived signal voltage.

2. A signal translating circuit comprising:

a field effect semiconductor device having first and second electrodes formed on a substrate of semiconductor material and a gate electrode being insulated from said substrate, said first and second electrodes being connected to one another by a conductive channel, said substrate effectively operating to provide a pair of rectifying junctions respectively between said first and second electrodes and said substrate, means for connecting said gate electrode and said first and second electrodes as a signal translating circuit, signal supply means coupled to one of said first, second and gate electrodes, deriving means coupled to said substrate and cooperating with at least one of said rectifying junctions for deriving a rectified signal voltage from said substrate, and signal utilization means coupled to receive said derived rectified signal voltage.

3. In combination:

a field effect semiconductor device having first and second electrodes formed on a substrate of semiconductor material having a predetermined type impurity, and a gate electrode being insulated from said substrate, said first and second electrodes being connected to one another by a conductive channel, said gate electrode being A-C coupled to said substrate by means of intrinsic capacitance, and a pair of rectifying junctions respectively between said first and second electrodes and said substrate, bias circuit means for biasing said first and second electrodes with respect to each other in a manner such that majority current carriers flows from said first to said second electrode through said conductive channel, biasing circuit means for biasing said gate electrode to a potential with respect to the potential of said first electrode so that said channel is rendered nonconductive, input circuit means connected between said gate electrode and a point of reference potential for applying input signals to said field effect semiconductor device, and output circuit means connected between said substrate and said point of reference potential for deriving an output voltage from said substrate when said input signals are of such polarity relative to the polarity of the potential of said first and second electrodes that said rectifying junctions are rendered conductive, said input signals being coupled to said substrate of semiconductor material through said intrinsic capacitance whereby the magnitude of the current flow through said output circuit and said substrate is a function of the amplitude of said input signals.

4. An electrical circuit comprising:

an insulated gate field effect transistor including source, drain and gate electrodes formed on a semi-conductor substrate, with said gate electrode and said semiconductor substrate being coupled by intrinsic capacitance, and with said substrate being respectively coupled to said source and drain electrodes by a pair of rectifying junctions, means connecting said source, drain and gate electrodes to condition said transistor to operate as the active element of said circuit, means for coupling input signals of a predetermined frequency to said gate electrode, and deriving means coupled to said substrate and cooperating with at least one of said rectifying junctions for deriving a signal voltage from said substrate that is a function of the amplitude and of the frequency of said input signals and signal utilization means coupled to receive said derived signal voltage.

5. A signal translating circuit comprising:

a field effect semiconductor device having source and drain electrodes formed on a substrate of semiconductor material, and a gate electrode being insulated from said substrate, said field effect semiconductor device having intrinsic capacitance coupled between said gate electrode and said substrate, said source and drain electrodes being connected to each other by a conductive channel, means intrinsic to said field effect semiconductor device providing a pair of rectifying junctions respectively between said source and drain electrodes and said substrate, means for connecting said source and drain electrodes to each other, input circuit means for applying input signals to said gate electrode of a magnitude sufficient to forward bias at least one of said rectifying juections to produce current flow therethrough, circuit means coupled to said substrate for deriving a rectified signal voltage in response to said current flow, and signal utilization means coupled to receive said rectified signal voltage.

6. In combination:

a field effect semiconductor device having first and second electrodes formed on a substrate of semiconductor material, and a gate electrode being insulated from said substrate, said first and second electrodes being connected to one another by a conductive channel, and circuit means for applying input signals of a predetermined frequency between said gate electrode and one of said first and second electrodes, circuit means for connecting said first and second electrodes in a closed path so that majority current carriers flows through said conductive channel, and output circuit means coupled between said substrate and said one of said first and second electrodes to derive a rectified output voltage from said field effect semiconductor device that is a function of the amplitude and the frequency of said input signals.

7. In combination:

a field effect semiconductor device having first and second electrodes formed on a substrate of semiconductor material, and a gate electrode being insulated from said substrate, said first and second electrodes being connected to each other by a conductive channel, said substrate and said first and second electrodes operating effectively as a pair of rectifying junctions connected between said first and second electrodes and said substrate, respectively, means coupled to one of said first and second electrodes for applying input signals to said field effect semiconductor device, an output circuit connected between the other of said first and second electrodes and a point of reference potential to derive output signals, a parallel circuit comprising a capacitor and a resistor connected between said substrate and said point of reference potential for deriving a rectified voltage from said substrate as a function of the amplitude of said input signals, and means for coupling said substrate to said gate electrode whereby said rectified voltage from said substrate biases said gate electrode as a function of the amplitude of said input signals.

8. A clipping circuit comprising:

a field effect transistor having first and second electrodes formed on a substrate of semiconductor material and a gate electrode being insulated from said substrate, said substrate of semiconductor material effectively operating to provide a pair of rectifying junctions between said substrate, and said first and second electrodes respectively, means for applying an input signal between one of said first and second electrodes and a point of reference potential, an output resistor connected between the other of said first and second electrodes and said point of reference potential to derive output signals, circuit means connected between said substrate and said point of reference potential to derive a direct current voltage as a function of the input signal voltage, and means coupled between said substrate and said gate electrode including a source of bias potential for biasing said field effect semiconductor device to cut off at predetermined amplitudes of said input signals, and means coupled to said resistor for deriving output signals from said field effect semiconductor device, said output signals being clipped at a constant angle regardless of the amplitude of said input signals.

9. In combination:

a field effect semiconductor device having first and second electrodes formed on a substrate of semiconductor material, and a gate electrode being insulated from said substrate, said substrate of semiconductor material effectively operating to provide a pair of rectifying junctions respectively, between said first and second electrodes and said substrate, input circuit means connected between one of said first and second electrodes and a point of reference potential for applying input signals to said semiconductor device, output circuit means connected between the other of said first and second electrodes and said point of reference potential for deriving output signals from said field effect semiconductor device, a circuit comprising the parallel combination of a resistor and a capacitor connected between said substrate and said point of reference potential to derive a direct current voltage from said substrate as a function of the amplitude of said input signals, and means for coupling said direct current voltage from said substrate to said gate electrode to bias said gate electrode as a function of the current flow through said pair of rectifying junctions whereby said field effect semiconductor device conducts when said input signal has an instantaneous voltage value that is more negative than the value of the bias potential applied to said gate electrode and said field effect semiconductor device is rendered nonconductive when said input signal has an instantaneous voltage value that is more positive than the bias potential applied to said gate electrode.

10. In combination:

a field effect transistor having gate, source and drain electrodes formed on a substrate of semiconductor material, said substrate effectively operating in combination with said drain and source electrodes as a pair of rectifying junctions coupled between said drain and source electrodes and said substrate respectively, first input circuit means coupled to said gate electrode for applying input signals of a first frequency to said field effect transistor, second input circuit means coupled to said source electrode for applying input signals of said first frequency to said field effect transistor, biasing circuit means coupled to said drain and source electrodes for biasing said drain electrode to a predetermined bias potential with respect to the potential of said source electrode, circuit means coupled to said substrate for deriving a bias source from said substrate as a function of the current flow through one of said rectifying junctions, and means coupling said bias potential derived at said substrate to said gate electrode to control the conduction point of said field effect transistor, whereby the magnitude of the current flow through said source and drain electrodes is a function of the phase difference of said input signals and of the magnitude of the input signal applied to said gate electrode.

11. A phase detector circuit comprising:

a field-effect transistor having gate, source and drain electrodes formed on a substrate of semiconductor material, said gate electrode being insulated from said substrate, said drain and source electrodes being coupled to each other by a conductive channel, said substrate effectively operating to provide a pair of rectifying junctions connected between said drain and source electrodes, and said substrate respectively, filter circuit means coupled to said substrate for deriving a direct current voltage from said substrate, circuit means including a source of bias potential connected between said substrate and said gate electrodes to bias said gate electrode to a predetermined bias potential and for coupling the direct current voltage derived from said substrate to said gate electrode, output circuit means coupled to said drain electrode including an output resistor to derive an output signal from said field-effect transitor, and separate input circuit means for applying input signals of the same frequency to said gate and source electrodes simultaneously, whereby the magnitude of the output signal is a function of phase difference of said input signals.

12. A phase detector circuit comprising:

a field-effect transistor having gate, source and drain electrodes formed on a substrate of semiconductor material, said gate electrode being insulated from said substrate, said drain and source electrodes being coupled to each other by a conductive channel, said substrate effectively operating to provide a pair of rectifying junctions between said drain and source electrodes, and said substrate respectively, filter circuit means coupled to said substrate for deriving a direct current voltage from said substrate, circuit means for coupling the direct current voltage derived from said substrate to said gate electrode, first source of input signals coupled to said gate electrode for applying input signals of a predetermined frequency, and second source of input signals coupled to said source electrode for applying input signals of said predetermined frequency so that the rectifying junction between said substrate and said source electrode is rendered conductive as a function of the magnitude of the input signals from said second source of input signals whereby said gate electrode is biased as a function of the magnitude of the input signals from said second signal source providing insensitivity to variations in the magnitude of the input signals from said second source of input signals, and output circuit means coupled to said drain electrode for deriving an output signal having an amplitude which is a function of the phase difference of said input signals.

13. A phase detector circuit comprising:

an insulated gate field-effect transistor having gate, source and drain electrodes formed on a substrate of semiconductor material, means including a conductive channel connecting said drain and source electrodes to each other, said substrate of semiconductor material effectively operating to provide a pair of rectifying junctions between said substrate, and said drain and source electrodes respectively, filter circuit means coupled to said substrate for deriving a direct current voltage from said substrate, circuit means including a source of bias potential connected between said substrate and said gate electrodes to bias said gate electrode to a predetermined bias potential and for coupling the direct current voltage derived from said substrate to said gate electrode, output circuit means including a source of bias potential and an output resistor coupled to said drain electrode for biasing said drain electrode with respect to said source electrode and for deriving an output signal from said field-effect transistor, and separate input circuit means for applying input signals of the same frequency to said gate and source electrodes simultaneously, whereby the current flow through said conductive channel is a function of the phase difference between said input signals and of the magnitude of the input signal applied to said gate electrode.

14. An electrical circuit comprising:

an insulated field-effect transistor having gate, source drain and substrate electrodes, said substrate effectively operating to provide a pair of rectifying junctions between said drain and source electrodes, and said substrate respectively, filter circuit means coupled to said substrate for deriving a rectified voltage, means coupling said rectified voltage from said substrate to said gate electrode, separate input circuit means coupled to said gate and source electrodes respectively for applying input signals having the same frequency, and output circuit means coupled to said drain electrode for deriving an output signal from said electrical circuit having an amplitude which is a function of the phase difference between said input signals.

15. In combination, a field effect semiconductor device having: first and second electrodes formed on a surface thereof, a substrate of semiconductor material having P-type impurity, a gate electrode being insulated from said substrate, means including a conductive channel connecting said first and second electrodes to each other, means forming a pair of rectifying junctions respectively between said first and second electrodes and said substrate, and means including intrinsic capacitance connecting said gate electrode to said substrate, bias circuit means for biasing said first and second electrodes with respect to each other in a manner such that majority current carrier flows from said first to said second electrode through said conductive channel, bias circuit means for biasing said gate electrode to a potential with respect to the potential of said first electrode so that said conductive channel is rendered non-conductive, input circuit means connected between said gate and first electrodes for applying input signals of varying frequency to said field effect semiconductor device, and output circuit means connected beween said substrate and said first electrode for deriving an output voltage from said substrate so that said input signals are coupled to said substrate through said intrinsic capacitance and when said input signals are more positive than the potential of said first and second electrodes said rectifying junctions are rendered conductive, whereby the output voltage derived from said substrate is a function of the frequency of said input signal.

16. An electrical circuit comprising:

a field effect transistor having: drain and source electrodes formed on a substrate of semiconductor material having a predetermined impurity, a gate electrode being insulated from the substrate, means including a conductive channel connecting said drain and source electrodes to each other, and, means forming a pair of rectifying junctions respectively between said source and drain electrodes, and said substrate, input circuit means connected between said gate and source electrodes for applying input signals to said field effect transistor, first output circuit means including a resistor for deriving amplified output signals, and second output circuit means connected between said substrate and said source electrodes, said second output circuit means comprising a capacitor and a resistor having a predetermined time constant whereby the output signal derived from second output circuit means is a detected output signal.

17. An electrical circuit comprising:

an insulated gate field effect semiconductor device including source, drain and gate electrodes formed on a semiconductor substrate, means coupled to said source, drain and gate electrodes for connecting said semiconductor device as the active element of said electrical circuit, means for supplying input signals to be translated by said circuit to one of said electrodes, means for deriving a first output signal in translated form from another of said electrodes, and means for deriving a second output signal from said substrate which bears a predetermined relation to said input signals.

18. An electrical circuit comprising:

an insulated gate field effect semiconductor device including source, drain and gate electrodes formed on a semiconductor substrate, means coupled to said source, drain and gate electrodes for connecting said semiconductor device as the active element of said electrical circuit, means for supplying input signals of a predetermined frequency to said gate electrode, means for deriving a first output signal in translated form from one of said source and drain electrodes, and means for deriving a second output signal from said substrate which is a function of the ampiltude and frequency of said input signals.

19. An electrical circuit comprising:

an insulated gate field effect semiconductor device including source, drain and gate electrodes formed on a semiconductor substrate, means coupled to said source, drain and gate electrodes for connecting said semiconductor device as the active element of said electrical circuit, means for supplying input signals to be translated by said circuit to one of said electrodes, means for deriving a first output signal in translated form from another of said electrodes, and means for deriving a rectified output signal from said substrate which bears a predetermined relation to said input signals.

20. An electrical circuit comprising:

an insulated gate field effect semiconductor device including source, drain and gate electrodes formed on a semiconductor substrate, means coupled to said source, drain and gate electrodes for connecting said semiconductor device as the active element of said electrical circuit, means for supplying input signals of a predetermined frequency to said gate electrode, means for deriving a first output signal in translated form from one of said source and drain electrodes, and means for deriving a rectified output signal from said substrate which is a function of the amplitude and frequency of said input signals.

References Cited

UNITED STATES PATENTS

| | | | |
|---|---|---|---|
| 2,900,531 | 8/1959 | Wallmark | 307—88.5 |
| 3,010,033 | 11/1961 | Noyce | 307—88.5 |
| 3,021,433 | 2/1962 | Morrison | 307—88.5 |
| 3,056,888 | 10/1962 | Atalla | 307—88.5 |
| 3,102,230 | 8/1963 | Kahng | 307—88.5 XR |

ARTHUR GAUSS, *Primary Examiner.*

J. A. JORDAN, *Assistant Examiner.*